United States Patent [19]

Newsam

[11] 3,923,359

[45] Dec. 2, 1975

[54] MULTI-LAYER PRINTED-CIRCUIT BOARDS

[75] Inventor: William Newsam, Bournemouth, England

[73] Assignee: Pressey Handel und Investments A.G., Zug, Switzerland

[22] Filed: July 10, 1972

[21] Appl. No.: 270,400

[30] Foreign Application Priority Data

July 9, 1971 United Kingdom............... 32251/71

[52] U.S. Cl............... 339/17 M; 174/68.5; 317/101

[51] Int. Cl.² ........................................... H05K 1/07

[58] Field of Search.... 339/17 R, 17 D, 17 C, 17 E, 339/17 L, 17 M, 18 R, 18 C, 176 MP, 198 E; 317/101; 174/68.5; 29/625–629

[56] References Cited

UNITED STATES PATENTS

| | | | |
|---|---|---|---|
| 2,889,532 | 6/1959 | Slack | 339/17 M |
| 3,300,686 | 1/1967 | Johnson et al. | 339/17 X |
| 3,372,309 | 3/1968 | Stockdale | 317/101 CM |
| 3,462,832 | 8/1969 | Kubik | 174/68.5 X |
| 3,493,671 | 2/1970 | Horwitz et al. | 317/101 CE X |
| 3,564,115 | 2/1971 | Gribble et al. | 174/68.5 |
| 3,605,063 | 9/1971 | Stewart | 339/18 R |
| 3,660,726 | 5/1972 | Ammon et al. | 339/17 C X |

FOREIGN PATENTS OR APPLICATIONS

| | | | |
|---|---|---|---|
| 1,157,268 | 7/1969 | United Kingdom | 317/101 CM |

*Primary Examiner*—Roy D. Frazier
*Assistant Examiner*—Terrell P. Lewis
*Attorney, Agent, or Firm*—Blum Moscovitz Friedman & Kaplan

[57] ABSTRACT

Replacement of individual connections arranged between terminal contacts of a multi-layer printed-circuit board by conductors arranged inaccessibly between the sheets from which the board is fabricated, is made possible by providing, laterally of the bushed bores which provide access to these internal conductors, separate bushed terminal bores whose bushes are respectively connected to the bushes of the former by readily cut connector elements at the upper surface of the uppermost sheet of the board.

3 Claims, 2 Drawing Figures

MULTI-LAYER PRINTED-CIRCUIT BOARDS

Figure 1:
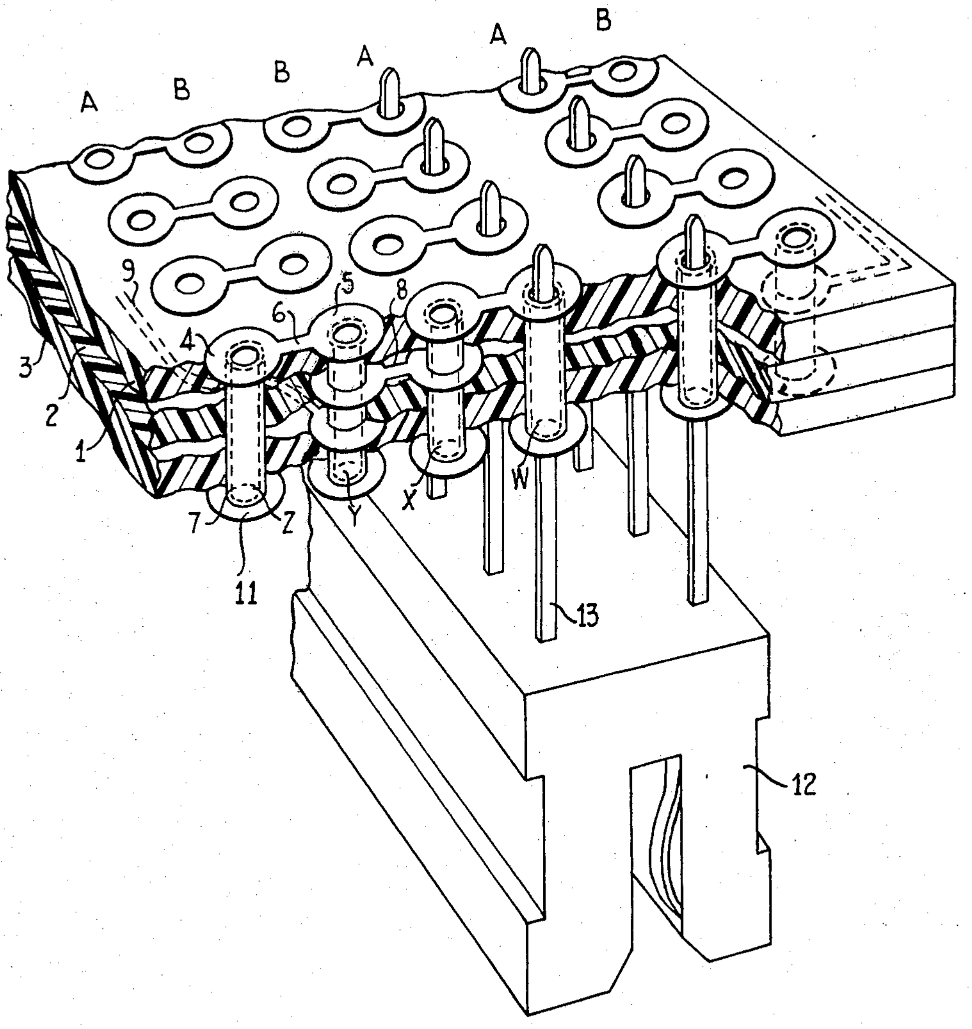

The present invention relates to multi-layer printed-circuit boards and to assemblages incorporating such boards.

Multi-layer printed-circuit boards generally take the form of bonded stacks of sheets or substrates of insulating material having printed-conductor patterns or layers on their faces; the patterns being formed typically by deposition of metal (say copper) upon appropriate areas of the substrate or by etching away unwanted areas of metal film which is bonded to the substrate. The substrates may be single-sided or double-sided, i.e., having a conductor pattern or layer on one face or both faces respectively, and in the latter case the stack will incorporate a thin insulating medium between opposing metallic patterns in the stack. The invention is applicable to multi-layer printed circuit boards incorporating single-sided and/or double-sided substrates, and employing so-called plated-through holes or the like which form electrical connections between and to predetermined layers or portions thereof of the boards.

The use of plated-through holes in multi-layer boards by facilitating the "crossing-over" of various electrical paths provided by the board, enables complex arrays of electrical paths to be formed in a very compact and reliable manner, and the laborious and time-consuming effort of point-to-point wiring between circuit elements and/or connectors carried by the board is avoided.

Multi-layer printed-circuit boards, particularly when they cater for many hundreds of connections to and between circuit elements and/or mounting sockets for plug-in functional units, represent a considerable capital outlay as regards their design and manufacture. Furthermore it is not always possible to ensure that complete finality has been reached in the operational requirements of the apparatus incorporating a multi-layer board and therefore changes may be required in any of the connection paths provided. However, in known types of multi-layer boards no special provision is made to meet changes in design requirements; difficulties being presented due to the inaccessibility of the internal layers and the connections thereto. Thereupon even in the case of a minor change of connections, the procedure would be slow, difficult, untidy and possibly unreliable. Indeed as more and more changes become necessary, the situation is aggravated until a point is soon reached when the board may have to be scrapped and replaced by another board incorporating all the revised connection requirements and involving costly redesign and manufacture. In some instances even when a single connection provided by a board needs revision, to cater for a modified operational requirement, it may be necessary to discard the board, and others of the same production batch, and incur the expense and delay of re-design and manufacture.

Also with the known types of multi-layer boards, even though a very high standard of reliability has been attained it is possible for a disconnection or a short-circuit to become evident at an inaccessible point of a connection path. Again in such instances makeshift methods may have to be adopted to circumvent the faults, but even in these circumstances it may be necessary to scrap the faulty board.

The above-mentioned difficulties have tended to restrict the usage of multi-layer boards especially where relatively small batch production of complex boards would be required; electronic equipment manufactures in some instances preferring to retain (with all its disadvantages) the more conventional point-to-point wiring practice particularly in those fields where there is the possibility, however remote, of some changes arising in the operational requirements of the apparatus.

The disadvantages alluded to may be evident for example in so-called back-planes for electronic data-processing equipments or the like where a complex multi-layer board (involving say twelve layers) may carry, in side-by-side relationship, about thirty multi-point socket-connectors for insertion of plug-in functional units, each of the latter having of the order of 100 plug-connection points usually at an edge of a printed conductor board. In such a back-plane, where the requirement is to contact earth and voltage sources and input/output paths to predetermined points of the connectors and to provide other electrical interconnections between various connector points, the connectors for acceptance of the plug-in functional units are provided with terminal pins (usually two rows) which extend from their rear faces, the pins being passed through and soldered to particular plated-through holes already providing a connection to a track or section of one or more of the conductive layers.

An object of the present invention is to provide an improved multi-layer printed-circuit board or a back-plane incorporating such a board in which the before-mentioned difficulties are enabled to be overcome in a simple and inexpensive manner.

According to the invention there is provided a multi-layer printed-circuit board having connection means spatially located over the surface of the board and extending through it, characterised in that each of a first plurality of said connecting means provides connection to one or more printed conductor elements within the board and each of a second plurality of said connecting means is provided for establishing a direct connection to a terminal member of device external to the board each said connecting means of said second plurality being connected to an adjacent connecting means of said first plurality by a readily-severable linking-track comprising a printed-conductor element formed at a surface of the board.

Also according to the invention said connecting means comprise plated-through holes and the plated-through holes constituting said second connecting means facilitate connection of a said terminal member by passing the member through the hole and applying a soldered joint.

According to an aspect of the invention there is provided a back-plane for a plurality plug-in functional units and comprising a multi-layer printed circuit, of the kind employing plated-through holes, in combination with multi-point socket connectors for said units and mounted in side-by-side relationship at one face of said board, characterised in that each of a first plurality of said plated-through holes provides connection to one or more printed circuit elements within the board and each of second plurality of said plated-through holes embraces and is electrically connected to a terminal tag of a said socket and each plated-through hole of said second plurality is connected to an adjacent plated-through hole of said first plurality by a readily severable linking-track comprising a printed-conductor element formed at that surface of the board from which the ends of the terminal tags protrude.

The invention also envisages the provision of a method of changing the connections provided by a back-plane as defined in the previous paragraph and this involves the severance of a said linking-track appropriate to an aforesaid tag appertaining to a connection required to be changed and introducing a wire-connection between that tag and any other required tag of the back-plane, the linking-track of the last-mentioned tag being severed or not as required.

Figure 2:
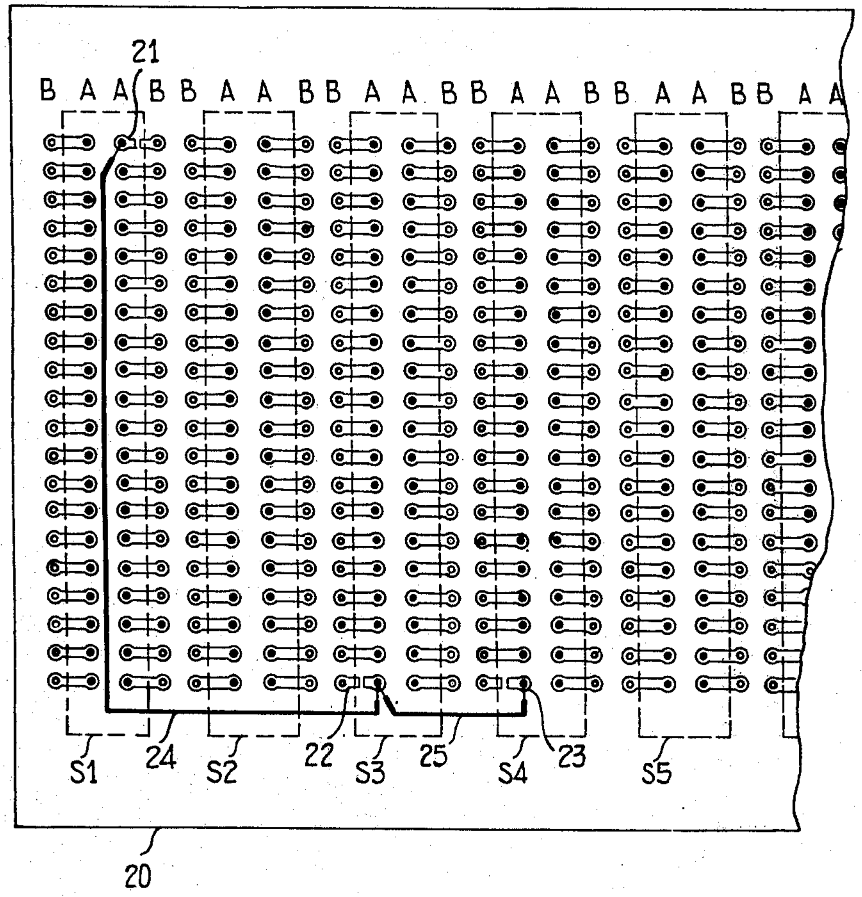

The invention will be better understood from the following description of the preferred method of carrying it into effect which should be read in conjunction with the accompanying drawings comprising FIGS. 1 and 2.

FIG. 1 is a greatly enlarged perspective view of a small portion of the multi-layer printed-circuit board constructed in accordance with present invention and having a portion of a partly-inserted edge-type multi-point socket in association therewith, whereas FIG. 2 is a rear view of a portion so-called back-plane for plug-in functional units of an electronic equipment showing the locations in outline of a plurality of multi-point socket-connectors for said units.

The printed-circuit board partly represented in FIG. 1 is of relatively simple form, to conveniently illustrate the invention, in that it is merely of the four-layer type, i.e., it comprises four conductor-pattern arrays or layers separated by three sheets of insulating material 1, 2 and 3. It will be appreciated that in many applications, printed-conductor boards having a much greater number of conductor-pattern layers may be employed; some of the internal layers being used for instance for earth and screening purposes and for distribution of voltage supplies. However, in the exemplary illustration, the three insulator sheets are bonded together to produce a rigid construction and, of these, sheet 1 has a regular array of conductor sections of metal film adherent to the upper face, each section forming a linking-track such as 6 incorporating annular pads 4 and 5 at its extremities. Each said pad is electrically connected to the metallic wall of an appropriate plated-through hole of the board. The plated-through holes of the board are conveniently designated as being in columns A and B; those accommodated in columns B being utilised as necessary for the establishment of connections to internal conductor-sections of the board whereas those accommodated in columns A serve no such purpose, since the conductive wall of each such hole is merely connected by way of an external linking track 6, to the conductive wall of a plated-through hole immediately to its left or right in a column B.

The middle sheet 2 of the bonded board is double-sided in that an array of sections of metal film such as 8 and 9 is provided at both faces. These sections incorporate annular pads, connected by conductive tracks, and establish connections between requisite plated-through holes of columns B. Obviously a considerable variety of connections involving two or more plated-through holes of columns B may be provided in each of the conductor patterns or layers of the double-sided insulator sheet. Moreover, the crossing-over of conductor paths is catered for in known manner by diverting a path from one intermediate layer to another, as may be required, through the intermediary of the wall of a relevant plated-through hole.

The lower sheet 3 of the bonded board merely has annular metallic pads such as 11 formed upon its external face, a pad being provided for each printed-through hole of the card. However it is evident that the printed-conductor pattern at the lower face of insulator sheet 2 may instead be bonded to the upper face of sheet 3, making the latter double sided.

In known forms of multi-layer printed-circuit boards, plated-through holes which are employed for internal connections are also used, as and when required, for the establishment of direct connection to terminal tags or wires of circuit elements or socket connectors; the tag being passed through the hole and connected to the conductive wall of the hold by a soldered joint. The previously mentioned disadvantages of this technique are overcome, according to the present invention by the provision of the additional plated-through holes of columns A which now serve to take the tags or wires of components, and which may be individually isolated by the simple process of interrupting the relevant exposed track-section 6 by making two spaced transverse cuts in its middle region and removing the intervening portion by peeling it from the board.

The technique of isolating a tag, or the like, and the related pad and plated-through hole, is employed when a change of operational requirement of the equipment necessitates a change in the routing of the connection hitherto provided by printed-circuit board in respect of the tag, and under these circumstances a new connection is set up by connecting an external wire from the tag to one or more similar tags which may have been otherwise isolated; the tag connections preferably being established by dry-wrap joints involving the use of a hand tool. In the case of some wire-ended components (such as resistors) which may be connected between printed-through holes of the kind involved in the columns A, it may not be practicable to employ a dry-wrap connection in which case a soldered joint would be used; the connection being made either to the protruding wire-end of the component or to the isolated pad of the pertinent external linking track. In the case of the component being inserted from the upper face of the board, as may be the case in some instances, it may be expedient to effect connection to said pad.

The particular multi-layer printed circuit shown in FIG. 1 with its regular array of plated-through holes and short external linking-tracks such as 6, is intended for use in conjunction with multi-point socket-connectors, such as 12, as a back-plane serving a plurality of plug-in functional units. The terminal tags, such as 13, of the typical socket which are in equi-spaced pairs, pass through respective ones of two adjacent A columns of plated-through holes. It is to be noted that the socket-tags are of rectangular cross-section to enable wires to be connected to them by so-called dry-wrapping effected by a hand tool. However, with the body of the socket slightly clear of the face of sheet 3 of the multi-layer board and the tags emerging from the other face of the board, soldered joints are made between the tags and those pads of the external linking-tracks which embrace them. Thus the socket is secured in position and the tags are connected, by way of the relevant external linking tracks, to the internal conductor system of the board. Taking the plated-through holes specifically designated W, X, Y and Z in relation to a particular series of interconnections; a) the tag 13 inserted in the hole W is connected to the conductive wall of hole X by an external linking track, b) the wall of hole X is connected to the conductive wall of hole Y by an internal track-section 8, c) the conductive wall of hole Y is also connected to the conductive wall of hole Z through the intermediary of an external linking-track and to the conductive wall of another plated-through hole (not shown) of a B column, by way of an internal track-section 9; the last-mentioned plated-through hole being connected to the wall of partner hole (in column A) by an external linking track. It will now be evident that, when all the sockets are connected to the printed-circuit board in the manner described and the board is mounted vertically in a frame of an equipment console so that the functional units can be located vertically with respect to the back-plane, the external linking-tracks and the emergent tags of of the socket-connectors are readily accessible say when the back-cover of the console is removed. This is illustrated in FIG. 2 which represents the rear view of a portion of a back-plane comprising a multi-layer printed-circuit board 20 involving arrangements such as those described and including multi-point sockets S1 to S5 mounted on the remote face of the board. As before the plated-through holes of the board are represented in columns A and B, and the terminal tags of the sockets (shown as dots) emerge through relevant plated-through holes of columns A and are soldered to the appropriate pads of the external links. By way of example it is assumed that a change of operational requirement has necessitated a change of connections in respect of the tags hitherto connected over the external linking-tracking 21, 22 and 23. Accordingly these tracks have been interrupted by removal of their central portions in the manner described, and new electrical connections have been established between the particular tags by insulated wires 24 and 25 which have their bared ends secured to the tags by a reliable dry-wrap joint.

What we claim is:

1. In a multi-layer printed circuit board of the type including bonded stacks of substrates of insulating material having a printed conductor patterned or layered surface improved means for conductively connecting one or more printed conductor elements located in said board, and for directly connecting a terminal member of an external device to said board comprising, a first plurality of plated-through holes spacially located over the surface of said board and extending fully through it, each printed conductor element located in said board being conductively connected to at least two plated-through holes of said first plurality, a second plurality of plated-through holes spatially located over the surface of said board and extending fully through it, each plated-through hole of said second plurality comprising a female socket for a male terminal member of a device external to said board, and a plurality of discrete, severable linking tracks, which are equal in number to the number of plated-through holes in each said plurality each plated-through hole of said first plurality being connected to a selected plated-through hole of said second plurality by one of said linking tracks, each of said linking tracks comprising a printed conductor element, which has a straight path which is located on said surface of said printed circuit board.

2. A back-plane for a plurality of plug-in functional units comprising, in combination, a multi-layer printed circuit board having plated-through holes and at least one plug-in functional unit provided with socket connectors mounted on a surface of said printed circuit board, each member of a first plurality of said plated-though holes being connected to at least one printed conductor element, each of said at least one printed conductor elements directly extending within said printed circuit board to another plated-through hole of said first plurality, each member of a second plurality of said plated-through holes comprising a female socket, a terminal tag of a said socket connector being housed therein and operatively connected thereto, each plated-through hole of said second plurality being connected to an adjacent plated-through hole of said first plurality only by a severable linking track, having a straight path comprising a printed conductor element located on that surface of said printed circuit board from which respective ends of terminal tags protrude.

3. The back-plane as claimed in claim 2, said plated-through holes being arranged in a substantially rectangular grid pattern on said board, members of said second plurality of plated-through holes being arranged in pairs of parallel contiguous rows thereon, a pair of rows thereof, being spaced from each other by a corresponding parallel pair of rows of members of said first plurality of plated-through holes.

* * * * *